United States Patent [19]

Hori et al.

[11] Patent Number: 5,337,169
[45] Date of Patent: Aug. 9, 1994

[54] METHOD FOR PATTERNING AN OPTICAL DEVICE FOR OPTICAL IC, AND AN OPTICAL DEVICE FOR OPTICAL IC FABRICATED BY THIS METHOD

[75] Inventors: Nobuo Hori; Yoshinobu Takano; Takashi Takahashi; Shigenori Nagano; Reiji Hashimoto, all of Tokyo, Japan

[73] Assignee: Kabushiki Kaisha Topcon, Tokyo, Japan

[21] Appl. No.: 24,110

[22] Filed: Feb. 23, 1993

Related U.S. Application Data

[63] Continuation of Ser. No. 755,425, Sep. 5, 1991, abandoned.

[30] Foreign Application Priority Data

Sep. 7, 1990 [JP] Japan ................. 2-238743

[51] Int. Cl.$^5$ .................. G02B 5/32; G02B 6/34; G03H 1/04
[52] U.S. Cl. ......................... 359/3; 359/15; 359/34; 385/37
[58] Field of Search ............... 359/15, 19, 34, 3; 385/10, 37

[56] References Cited

U.S. PATENT DOCUMENTS

| | | | |
|---|---|---|---|
| 3,885,856 | 5/1975 | Ostrowsky et al. | 359/34 |
| 4,378,142 | 3/1983 | Ono . | |
| 4,400,616 | 8/1983 | Chevillat et al. | 359/34 |
| 4,948,213 | 8/1990 | Hasegawa et al. | 359/18 |

FOREIGN PATENT DOCUMENTS 57-142608 9/1982 Japan ........................ 359/34

OTHER PUBLICATIONS

Lukosz et al, "Holograms Recorded and Read-Out with Evanescent Field of Guided Waves," pp. WD5-1-WD5-4, no date.
Pennington et al, "Fast Wave Optical Guide Couplers Using Holographic Elements," *IBM Technical Disclosure Bulletin*, vol. 13, No. 8, Jan. 1971, pp. 2280-2281.
"Hologram Recording and Read-Out with the Evanescent field of Guided Waves", W. Lukosz et al., Optics Communications, vol. 19, No. 2, Nov. 1976.

*Primary Examiner*—Martin Lerner
*Attorney, Agent, or Firm*—Finnegan, Henderson, Farabow, Garrett & Dunner

[57] ABSTRACT

A method of patterning an optical device for an optical IC whose purpose is to diffract a light beam incident on one surface of a device substrate to cause a light beam to emerge from another surface of the device. In this method, a layer of a substance of variable refractive index is formed on an optical substrate, coherent light is caused to irradiate the layer from the direction of the normal to the surface which will be the incidence side of the device when it is used or from the opposite side, and coherent light is caused to irradiate the layer from the direction of the normal to the surface which will be the emergence side of the device when it is used or from the opposite side to form an interference pattern on the layer that performs diffraction.

8 Claims, 8 Drawing Sheets

METHOD FOR PATTERNING AN OPTICAL DEVICE FOR OPTICAL IC, AND AN OPTICAL DEVICE FOR OPTICAL IC FABRICATED BY THIS METHOD

This application is a continuation of application Ser. No. 07/755,425 filed Sep. 5, 1991, now abandoned.

BACKGROUND OF THE INVENTION

1. Field of the Invention

This invention concerns a method for patterning an optical device for integrated circuits (optical IC), and an optical device for optical IC fabricated by this method.

2. Description of the Prior Art

In the prior art, methods exist for patterning optical devices for optical IC wherein an interference pattern is traced out directly by an EB (electron beam) or laser beam. Other methods are also known wherein a mask with an interference pattern is first prepared by tracing out a pattern directly on film using an EB or laser, and the pattern is then transferred to an optical substrate.

These conventional patterning methods however suffered from the inherent disadvantage that they required developing or other processing, and it was therefore difficult to obtain patterns wherein the pitch of the interference fringes was greater than 500 lines/mm expressed in terms of spatial frequency. In addition, it was difficult to form interference patterns of large surface area on the optical substrate, and furthermore the apparatus used in the conventional method used for patterning optical devices for optical IC was costly.

Further, as digitization was applied in manufacturing the optical devices for optical IC by the aforesaid conventional patterning method, diffracted light of unnecessary orders and quantization noise were produced, and the diffraction efficiency was also low.

SUMMARY OF THE INVENTION

It is therefore an object of the present invention to provide a method of patterning optical devices for optical IC which have better diffraction efficiency and interference fringes of finer pitch than those produced by the conventional methods, and to provide optical devices for optical IC fabricated by this method.

The method according to the invention is designed to pattern an optical device for optical IC whose purpose is to diffract a light beam incident on one surface of an optical substrate so that it emerges from another surface of same, and is characterized in that a layer of a substance of which the refractive index can be made to vary is formed on the optical substrate, coherent light is caused to irradiate the layer from the direction of the normal to the surface of the substrate which will be the incidence side of the device when it is used or from the direction of the normal to the surface which will be the opposite side, and coherent light is caused to irradiate the layer from the direction of the normal to the surface of the substrate which will be the emergence side of the device when it is used or from the direction of the normal to the opposite side so as to form an interference pattern which performs the aforesaid diffraction.

More specifically, this invention provides a method of patterning an optical device for optical IC whose purpose is to diffract a light beam incident on one surface of a rectangular optical substrate so that it emerges from another surface of same which is perpendicular to the incidence surface, and is characterized in that a layer of a substance of which the refractive index can be made to vary is formed on the optical substrate, parallel coherent light is caused to irradiate the layer from the side of the substrate which will be the incidence side of the device when it is used, parallel coherent light is caused to irradiate the layer from the opposite side of the substrate which will be the emergence side of the device when it is used, and an interference pattern is formed on the layer which performs the aforesaid diffraction.

Further, this invention provides a method of patterning an optical device for optical IC whose purpose is to diffract a light beam incident on one side of a rectangular optical substrate so that it emerges from another side of same, and is characterized in that a layer of a substance of which the refractive index can be made to vary is formed on the optical substrate, convergent coherent light is caused to irradiate the layer from the opposite side of the substrate which will be the incidence side of the device when it is used, divergent coherent light is caused to irradiate the layer from above its surface, and an interference pattern is formed on the layer which performs the above diffraction.

Further, this invention provides a method of patterning an optical device for optical IC whose purpose is to diffract a light beam incident on one side of a rectangular optical substrate so that it emerges from another side of same parallel to the side which is the incidence side, and is characterized in that a layer of a substance of which the refractive index can be made to vary is formed on the optical substrate, convergent coherent light is caused to irradiate the layer from the side of the substrate which will be the incidence side of the device when it is used, a divergent light beam is caused to irradiate the layer, and an interference pattern is formed on the layer which performs the aforesaid diffraction.

Further, this invention provides a method of patterning an optical device for optical IC which diffracts a light beam incident on one side of a rectangular optical substrate so as to cause a light beam to emerge from another side of same which is perpendicular to the incidence side, and is characterized in that a layer of a substance of which the refractive index can be made to vary is formed on the optical substrate, divergent coherent light is caused to irradiate the layer from the side of the substrate which will be the incidence side of the device when it is used, convergent coherent light is caused to irradiate the layer from the opposite side of the substrate which will be the emergence side of the device when it is used, and an interference pattern is formed on the layer which performs the aforesaid diffraction.

The diffraction efficiency of the optical device for optical IC fabricated by the patterning method of the present invention is better, and the pitch of the interference fringes produced is finer, than those of devices fabricated using conventional methods. Further, noise is greatly suppressed.

Further, according to the method for patterning an optical device for optical IC of the present invention, a higher performance optical device can be manufactured using an economical apparatus.

BRIEF DESCRIPTION OF THE DRAWINGS

FIG. 1 is a lateral view of an optical substrate.

FIG. 2 is a lateral view illustrating the way in which a layer of a substance is formed on the optical substrate shown in FIG. 1.

FIG. 3 is a plan view illustrating the way in which an interference pattern is formed on the layer of substance shown in FIG. 2.

FIG. 4 is a plan view of an optical device for optical IC showing an interference pattern formed on the layer of substance shown in FIG. 2.

FIG. 5 is a lateral view of the optical device for optical IC shown in FIG. 4.

FIG. 6 is a plan view for the purpose of illustrating the relationship between an incident light beam and an emergent light beam when the interference pattern formed on the layer of substance shown in FIG. 4, is used.

FIG. 7 is an oblique view for the purpose of illustrating the way in which an interference pattern is formed on a layer of a substance.

FIG. 8 is a plan view of an optical device for optical IC wherein an interference pattern has been formed on the layer of substance shown in FIG. 2.

FIG. 9 is a lateral view of an optical device for optical IC wherein the interference pattern shown in FIG. 8 has been formed.

FIG. 10 is an oblique view of an optical device for optical IC for the purpose of illustrating the relationship between an incident light beam and an emergent light beam when the interference pattern formed on the layer of substance shown in FIG. 8, is used.

FIG. 11 is a plan view illustrating the way in which an interference pattern is formed on a layer of a substance.

FIG. 12 is a plan view of an optical device for optical IC for the purpose of illustrating the interference pattern formed on the layer of substance shown in FIG. 11.

FIG. 13 is a plan view of an optical device for optical IC for the purpose of illustrating the relationship between an incident light beam and an emergent light beam when the interference pattern formed on the layer of substance shown in FIG. 12, is used.

FIG. 14 is a plan view illustrating the way in which an interference pattern is formed on a layer of a substance.

FIG. 15 is a plan view of an optical device for optical IC for the purpose of illustrating the interference pattern formed on the layer of substance shown in FIG. 14.

FIG. 16 is a plan view of an optical device for optical IC for the purpose of illustrating the relationship between an incident light beam and an emergent light beam when the interference pattern formed on the layer of substance shown in FIG. 15, is used.

DESCRIPTION OF THE PREFERRED EMBODIMENTS

The method for patterning an optical device for optical IC, and an optical device for optical IC fabricated by the method according to the present invention, will now be described with reference to the drawings.

FIG. 1 to FIG. 6 are drawings illustrating a first embodiment of the method for patterning an optical device for optical IC, and of an optical device for optical IC fabricated by the method according to the present invention.

Figure 1:
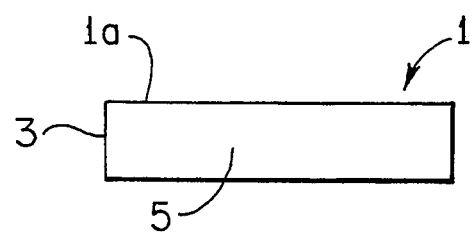
FIG. 1 to FIG. 6 are drawings showing a first embodiment of a method for patterning an optical device for optical IC, and of an optical device for optical IC fabricated by the method according to the present invention.
Figure 2:
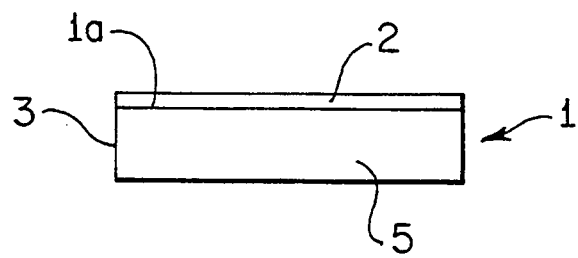
Figure 3:
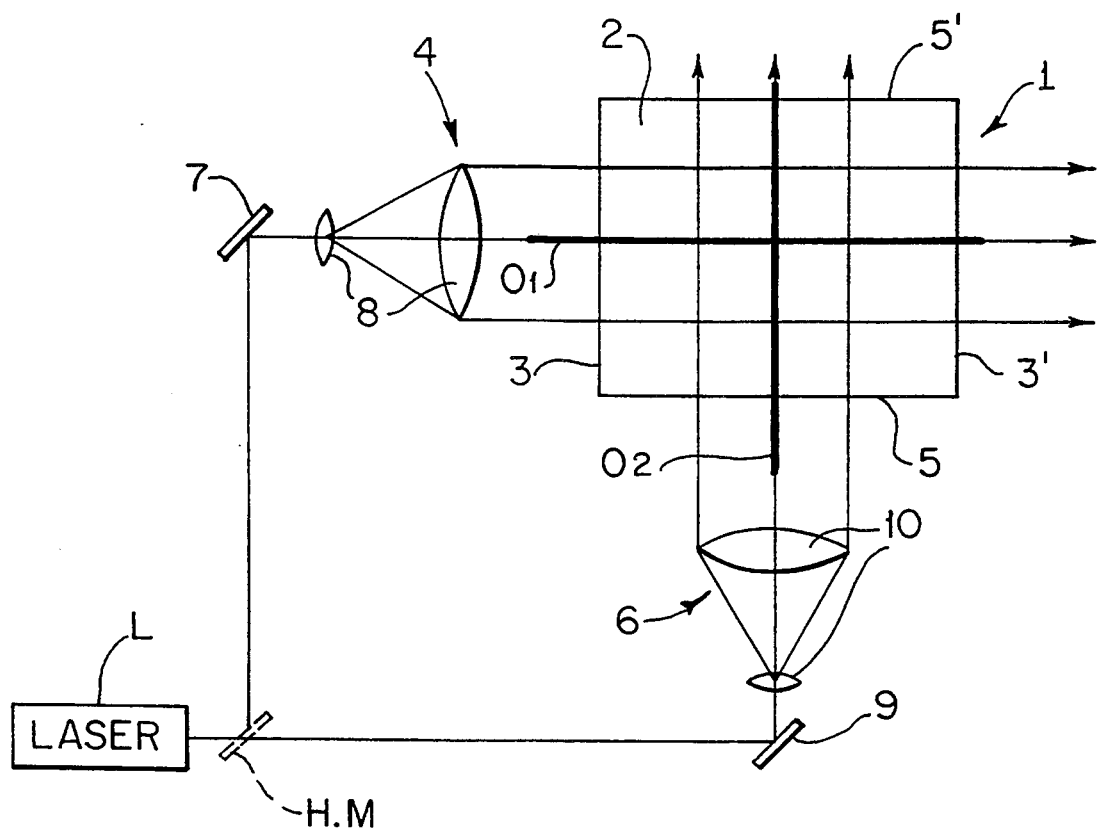

In FIG. 1, reference numeral 1 describes an optical substrate in the form of a rectangular parallelepiped. A layer 2 of a substance of which the refractive index can be varied by the occurrence of a photochemical reaction is formed on the surface 1a of this optical substrate 1 as shown in FIG. 2. This layer 2 may be formed for example by applying a photochemically polymerizable photopolymer, a dichromate gelatin or the like to the surface 1a. An optical system 4 is then positioned such that it can irradiate a side 3 of the optical substrate 1 with a light beam, and an optical system 6 is positioned such that it can irradiate a side 5 of the optical substrate 1 with a light beam as shown in FIG. 3. The side 3 will be the incidence surface of the light beam when the device is used, and the side 5 is parallel to a side 5' which will be the emergence surface of the light beam when the device is used, the side 5' being perpendicular to the side 3. The irradiating optical system 4 comprises a mirror 7 and a beam expander 8. The mirror 7 reflects coherent light from a laser source L described hereinafter, whereas the beam expander 8 expands the coherent light to convert it to a parallel light beam. The irradiating optical system 6 comprises a mirror 9 and a beam expander 10 which have similar functions to those in the optical system 4. Coherent light from the laser source L is split by the half mirror H.M, and thereby brought to the mirrors 7 and 9.

The optical system 4 irradiates the layer 2 from the direction of the normal 01 to the side 3, i.e. coherent light irradiates the layer 2 from the side 3 which will be the incident side of the device when it is used. The optical system 6 irradiates the layer 2 from the direction of the normal 02 to the side 5', i.e. coherent light irradiates the layer from the side 5 parallel to the side 5' which will be the emergence side of the device when it is used. The normals 01, 02, are in a plane parallel to the surface of the layer 2, and are mutually perpendicular.

Figure 4:
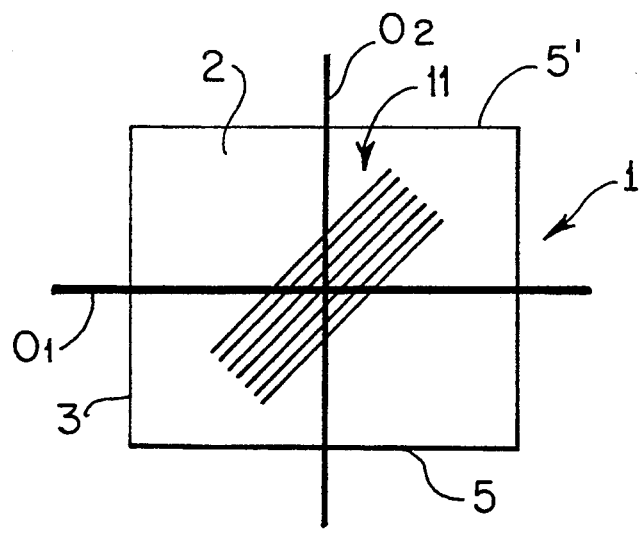
Figure 5:
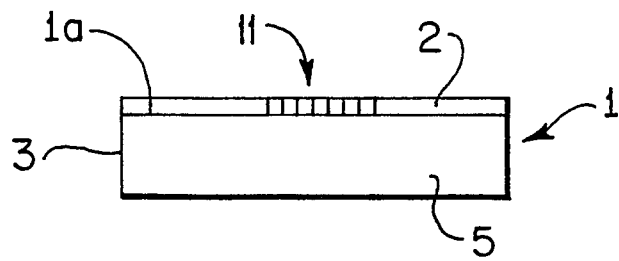
Figure 6:
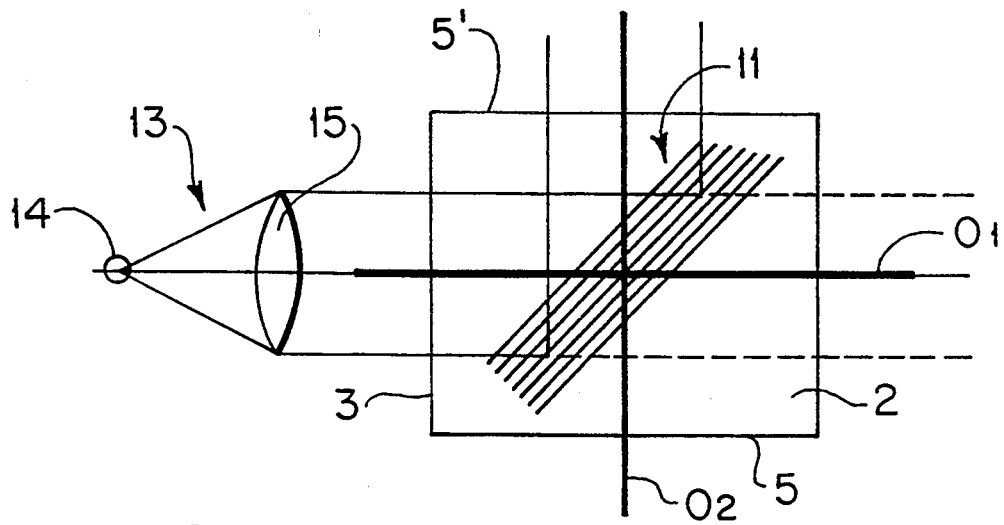

Parallel coherent light beams are thus caused to irradiate the layer 2 using the optical systems 4 and 6, and an interference pattern 11 is formed on the layer 2 due to the mutual interference of the beams. The optical systems 4 and 6 are disposed such that their optical axes lie along the normals 01, 02, and they irradiate the layer 2 with parallel light beams. The interference pattern 11 which is formed is therefore parallel to the direction of a diagonal of the optical substrate 1, as shown in FIG. 4 and FIG. 5. The optical substrate 1 having this interference pattern 11 is used as an optical device for optical IC.

When the optical device for optical IC thus fabricated is used, an irradiating optical system 18 is disposed in an equivalent position to the optical system 4, and a parallel light beam is caused to impinge on the layer 2 from the side 3. This parallel light beam is then diffracted in a direction perpendicular to the direction of incidence by the interference pattern 11, and emerges as a parallel light beam from the side 5' opposite the side 5.

In this first example, the interference pattern 11 functions as a plane mirror. If the wavelength of the coherent light is suitably chosen, the pitch of the interference pattern 11 can be set to any desired value, and a maximum spatial frequency of 5000-6000 lines/mm can easily be obtained depending on the nature of the substance of the layer 2. Reference numeral 14 denotes the optical source of the optical system 13, and 15 is a collimator lens which converts the light beam from the optical source 14 into a parallel light beam.

Figure 7:
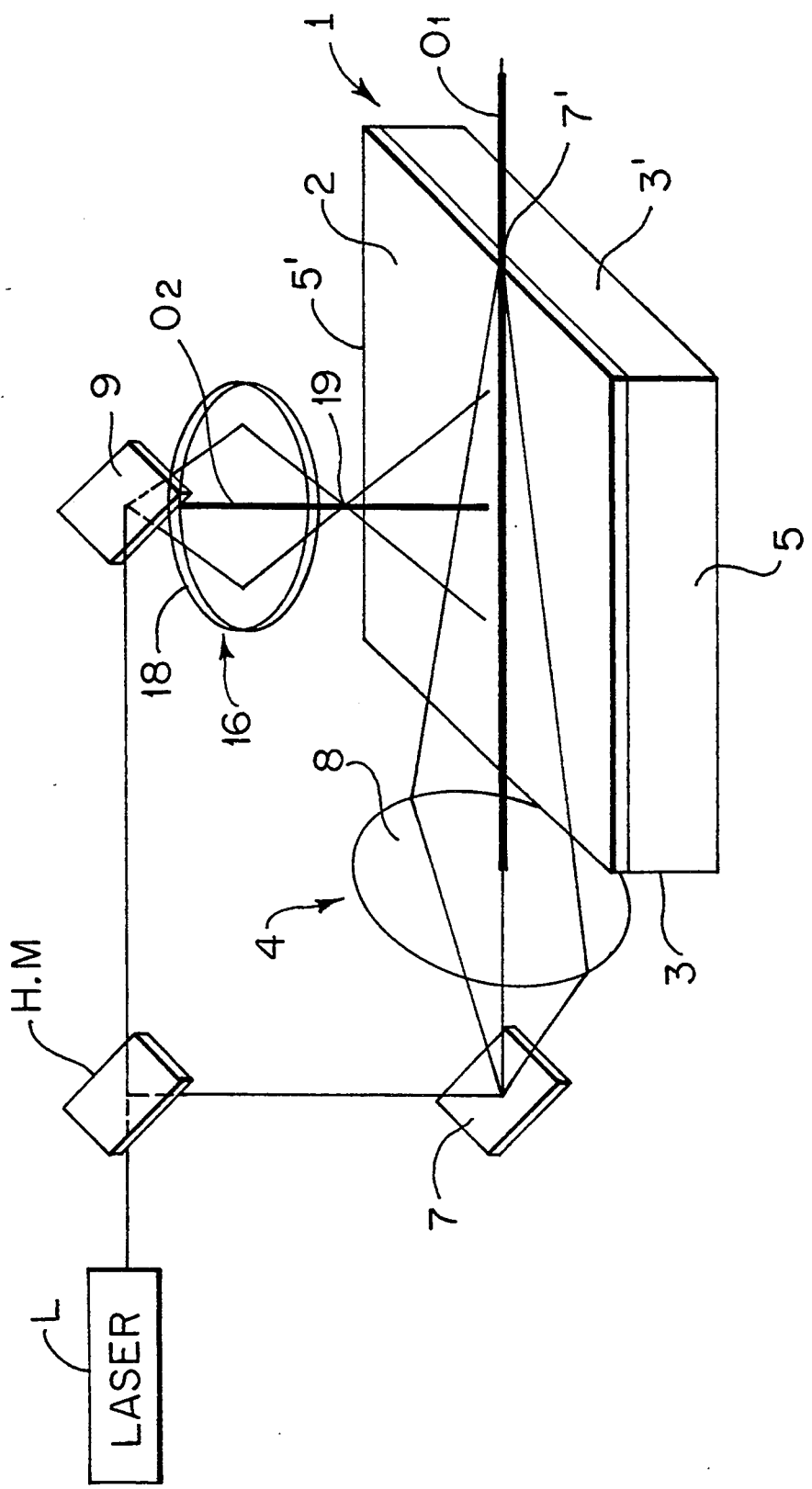
FIG. 7 to FIG. 10 are drawings showing a second embodiment of a method for patterning an optical device for optical IC, and of an optical device for optical IC fabricated by the method according to the present invention.

FIG. 7 to FIG. 10 are drawings illustrating a second embodiment of the method for patterning an optical device for optical IC, and of an optical device for optical IC fabricated by the method according to the present invention. As shown in FIG. 7, convergent coherent light is caused by the optical system 4 to impinge on a layer 2 from a side 3 of an optical substrate 1, i.e. convergent coherent light irradiates the layer 2 from the direction of the normal 01 to the side 3. This coherent light is converged to a convergence point 7' on a side 3' parallel to the side 3. Next, divergent coherent light is caused to irradiate the layer 2 from above the device as seen in the drawing by means of an optical system 16, i.e. divergent coherent light is caused to irradiate the layer 2 from the direction of the normal 02 to the surface of the layer 2. The normal 01 is in a plane parallel to the surface of the layer 2, however the normal 02 is not in a plane parallel to the surface of the layer 2 but perpendicular to it. In FIG. 7, 18 is an objective lens and 19 is an intermediate image-forming point.

Figure 8:
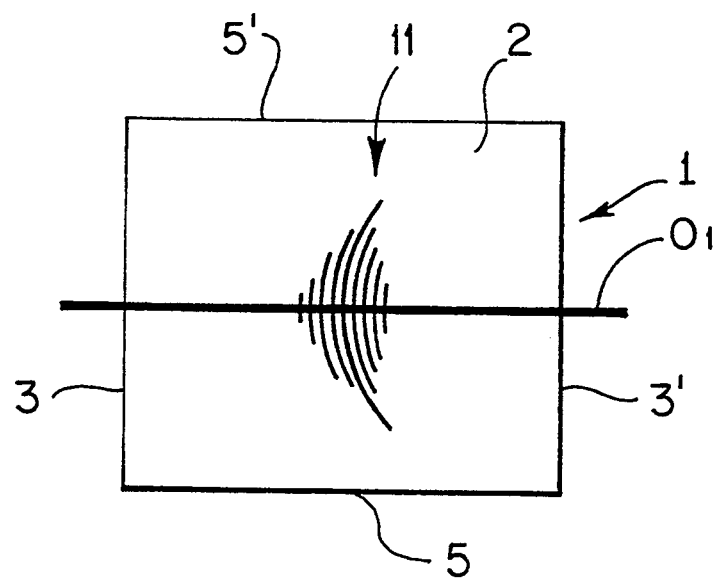
Figure 9:
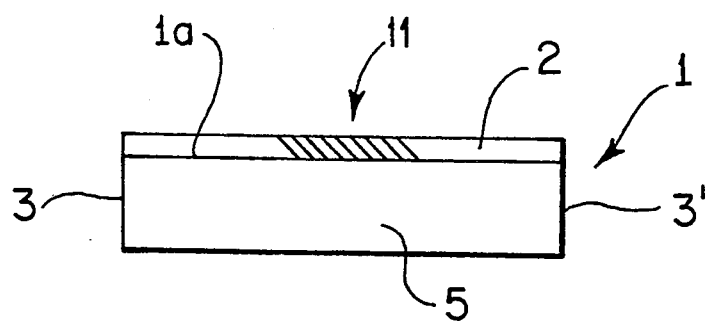

In the case of this second example, therefore, convergent coherent light is caused to irradiate the layer 2 from the side 3' which will be the incident side of the device when it is used, and a divergent coherent light beam is caused to irradiate the surface of the layer When these coherent light beams are caused to irradiate the layer 2 in this way, a curved interference pattern 11 is formed as shown in FIG. 8 and F is 9.

Figure 10:
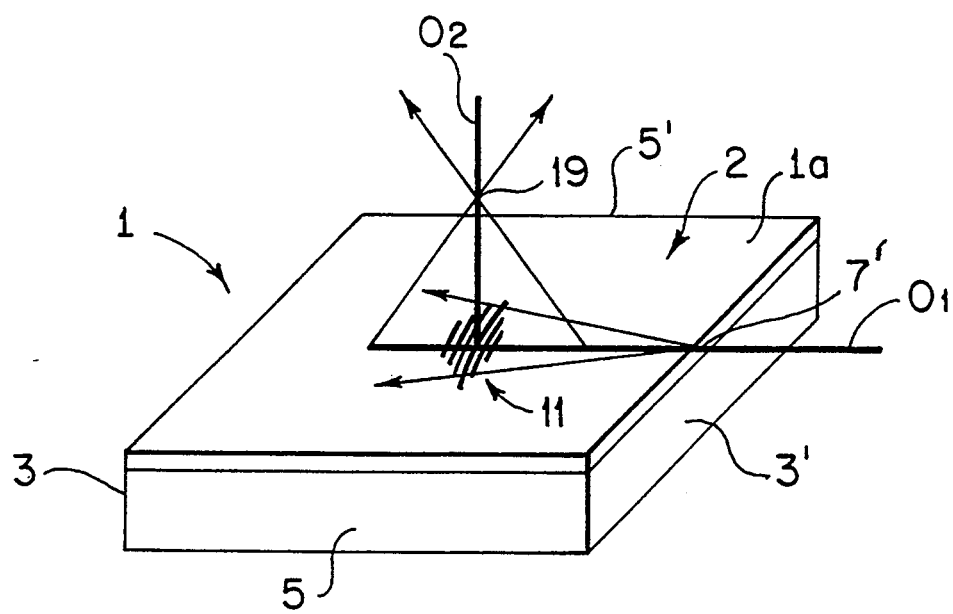

As shown in FIG. 10, when the optical device for optical IC having such a curved interference pattern 11 is used, a point light source is placed at the convergence point 7' on the side 3' which is the incidence side, and the layer 2 is irradiated by a divergent light beam from the side 3'. This light beam is diffracted by the interference pattern 11 so as to emerge from the surface 1a, and is focused to an intermediate image-forming point 19.

Figure 11:
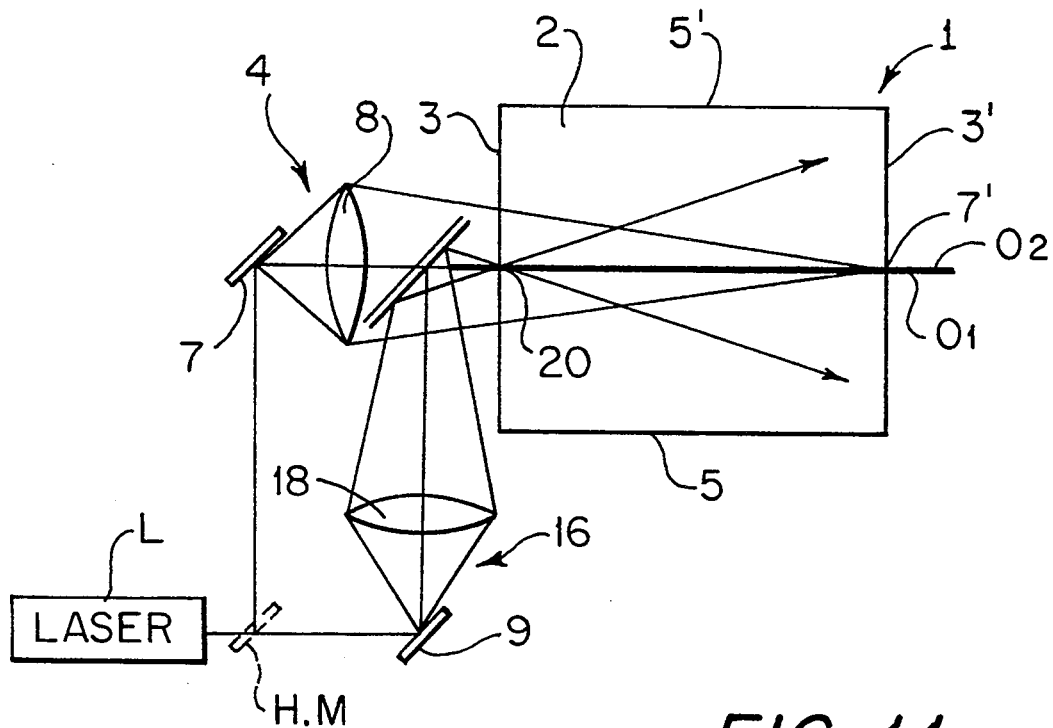
FIG. 11 to FIG. 13 are drawings showing a third embodiment of a method for patterning an optical device for optical IC, and of an optical device for optical IC fabricated by .the method according to the present invention.
Figure 12:
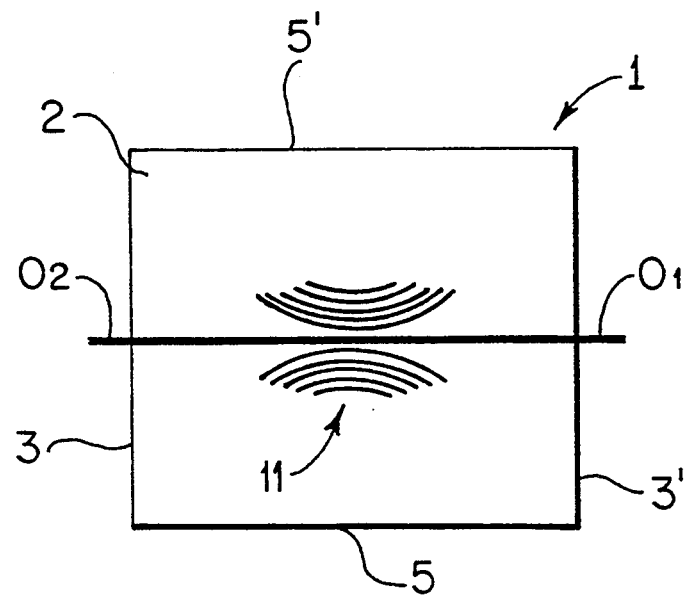
Figure 13:
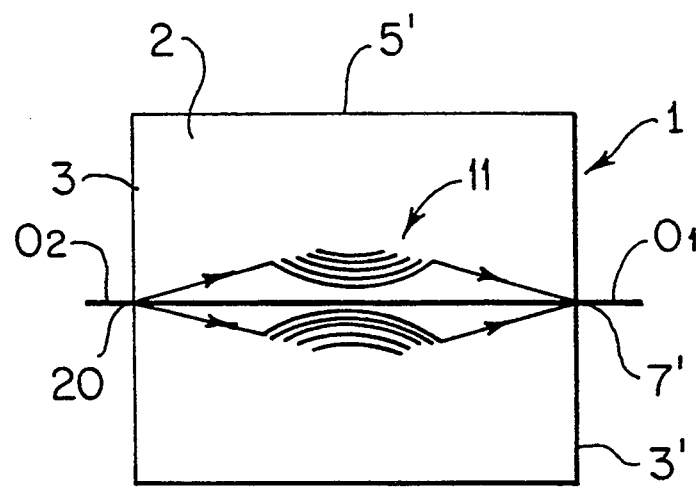

FIG. 11 to FIG. 13 are drawings showing a third embodiment of the method for patterning an optical device for optical IC, and of an optical device for optical IC fabricated by the method according to the present invention. As shown in FIG. 11, a convergent coherent light beam is caused to irradiate a layer 2 from a side 3 of an optical substrate 1 by means of an optical system 4. This coherent light beam is converged to a convergence point 7' of a side 3'. Another coherent light beam is caused to form an image at a convergence point 20 on the side 3 by means of an optical system 16, and the divergent coherent light beam from this convergence point 20 is thereby also caused to irradiate the layer 2. In this case, both convergent coherent light and divergent coherent light irradiate the layer 2 from the direction of the normal 01 to the same side 3 which will be the incidence side of the device when it is used. In this way, curved interference patterns 11 symmetrical about the normal 01 (which coincides with the normal 02 to the side 3') are formed on the layer 2 as shown in FIG. 12. These patterns diffract a light beam so that it emerges from the direction of the normal 02 to the side 3' which is parallel to the side which will be the incidence side of the device when it is used.

As shown in FIG. 13, when the device is used, a point light source is placed at a convergence point 20 so as to irradiate the layer 2 with a divergent light beam, and a light beam focused to the convergence point 7' by the interference pattern 11 is thus obtained.

Figure 14:
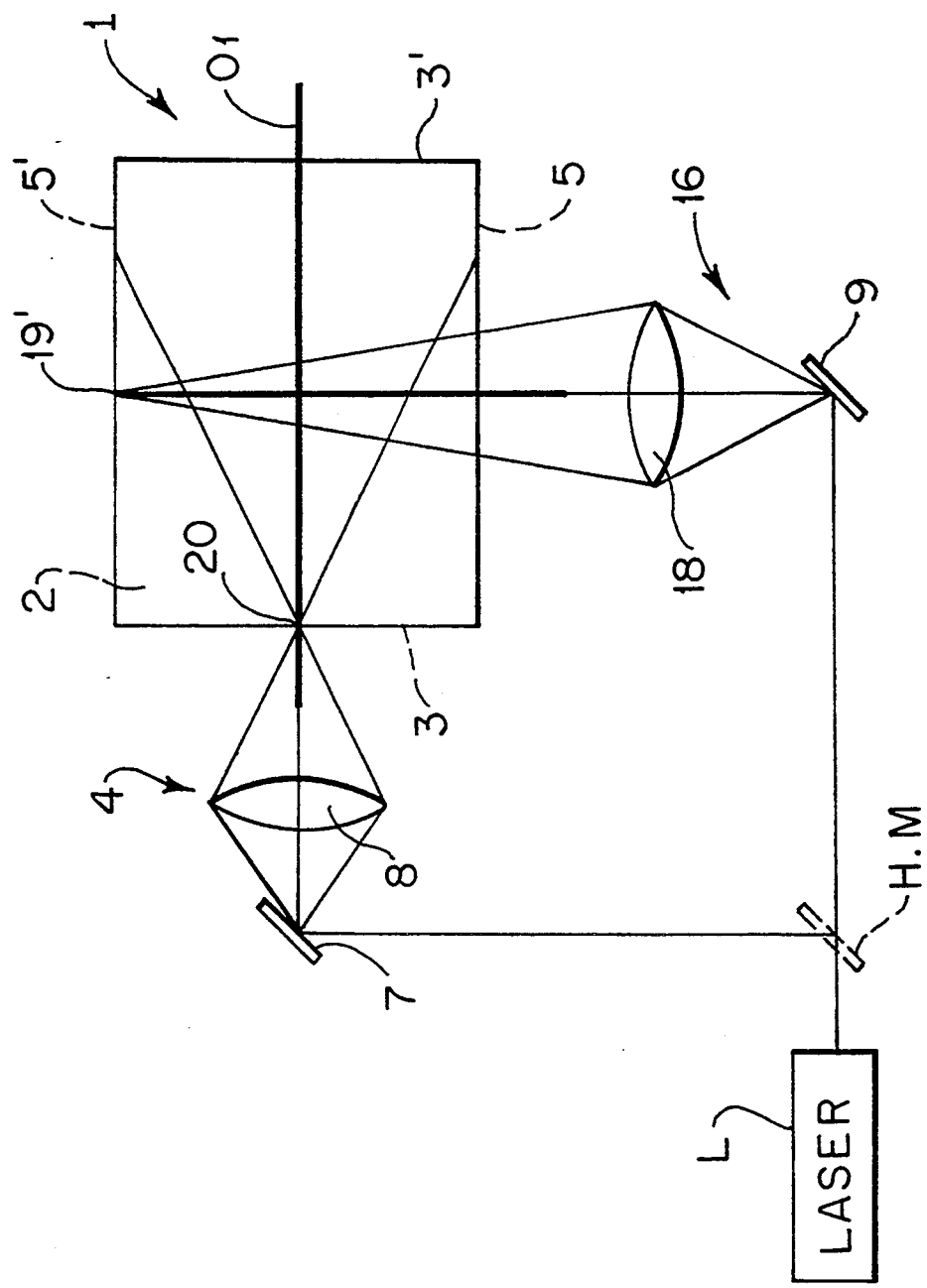
FIG. 14 to FIG. 16 are drawings showing a fourth embodiment of a method for patterning an optical device for optical IC, and of an optical device for optical IC fabricated by the method according to the present invention.
Figure 15:
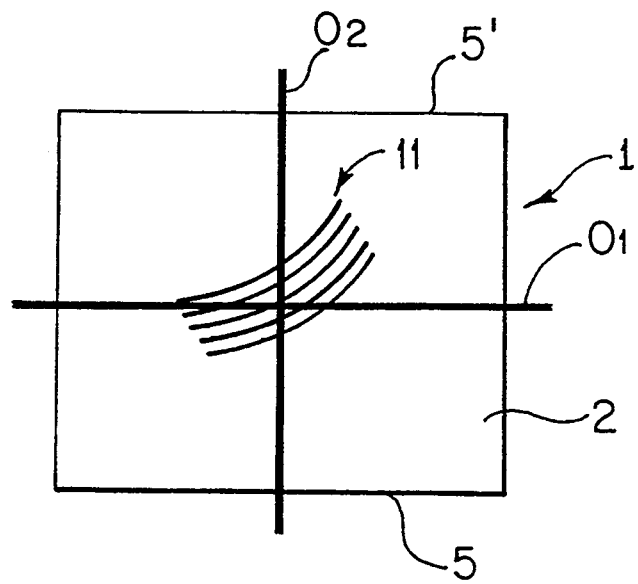
Figure 16:
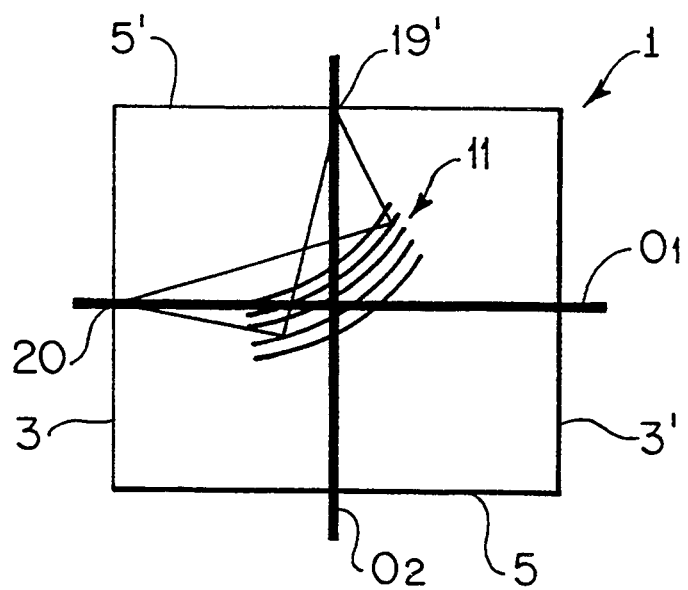

FIG. 14 to FIG. 16 are drawings showing a fourth embodiment of a method for patterning an optical device for optical IC, and of an optical device for optical IC fabricated by the method according to the present invention.

As shown in FIG. 14, a coherent light beam is first converged by means of an optical system 4 to a convergence point 20 on a side 3 which will be the incidence side of the device when it is used, and a divergent light beam is thus caused to irradiate a layer 2 from this side 3. Another coherent light beam made to converge by means of an optical system 16 to a convergence point 19' of a side 5' which will be the emergence side of the device when it is used, is also caused to irradiate the layer 2. A curved interference pattern 11 of the type shown in FIG. 15 is thereby formed.

As shown in FIG. 16, when this optical device for optical IC is used, a point light source is placed at the convergence 20 on the side 3 so as to irradiate the layer 2 with divergent light, and the interference pattern 11 diffracts the light beam so that it is focused to the convergence point 19'.

What is claimed is:

1. A method for forming a diffraction pattern in an optical device, comprising the steps of:
    forming a layer of a light-sensitive material as a waveguide on a substrate;
    irradiating the layer of light-sensitive material with a first beam of coherent light along a first axis; and
    irradiating the layer of light-sensitive material with a second beam of coherent light along a second axis simultaneously with the irradiation along the first axis, the second axis being substantially perpendicular to the first axis, and the first and second axes being substantially parallel to a surface of the layer of light-sensitive material.

2. A method for forming a diffraction pattern in an optical device according to claim 1, wherein said layer of light-sensitive material is a photochemically polymerizable photopolymer or a bichromate gelatin.

3. A method for forming a diffraction pattern in an optical device according to claim 1, wherein the first beam of coherent light is a first beam of parallel coherent and the second beam of coherent light is a second beam of parallel coherent light.

4. A method for forming a diffraction pattern in an optical according to claim 1, wherein the first beam of coherent light is a first converging beam of coherent light and the second beam of coherent light is a second diverging beam of coherent light.

5. A method for forming a diffraction pattern in an optical device, comprising the steps of:
   forming a layer of a light-sensitive material as a waveguide on a substrate;
   irradiating the layer of light-sensitive material with a first beam of coherent light along a first axis; and
   irradiating the layer of light-sensitive material with a second beam of coherent light along a second axis simultaneously with the irradiation with the first beam,
wherein the first and second axes are substantially parallel to a surface of the layer of light-sensitive material.

6. A method for forming a diffraction pattern in an optical device according to claim 5, wherein the first beam of coherent light is a first beam of parallel coherent light and the second beam of coherent light is a second beam of parallel coherent light.

7. A method for forming a diffraction pattern in an optical device according to claim 5, wherein the first beam of coherent light is a first converging beam of coherent light and the second beam of coherent light is a second diverging beam of coherent light.

8. A method for forming a diffraction pattern in an optical device, comprising the steps of:
   forming a layer of light-sensitive material as a waveguide on a substrate;
   irradiating the layer of light-sensitive material with a first beam of coherent light along an axis; and
   irradiating the layer of light-sensitive material with a second beam of coherent light along the axis simultaneously with the irradiation with the first beam,
wherein the first beam of coherent light is a first converging beam of coherent light and the second beam of coherent light is a second diverging beam of coherent light.

* * * * *

UNITED STATES PATENT AND TRADEMARK OFFICE
CERTIFICATE OF CORRECTION

PATENT NO. : 5,337,169
DATED : August 09, 1994
INVENTOR(S) : Nobuo HORI et al.

It is certified that error appears in the above-indentified patent and that said Letters Patent is hereby corrected as shown below:

Claim 4, column 6, line 67, after "ophical" insert --device--.

Signed and Sealed this

Twenty-eight Day of March, 1995

Attest:

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,337,169
DATED : August 9, 1994
INVENTOR(S) : Nobuo Hori et al

It is certified that error appears in the above-indentified patent and that said Letters Patent is hereby corrected as shown below:

Claim 4, column 6, line 67, after "optical" insert --device --.

This certificate supersedes Certificate of Correction issued March 28, 1995.

Signed and Sealed this

Eighteenth Day of July, 1995

Attest:

BRUCE LEHMAN

Attesting Officer     Commissioner of Patents and Trademarks